United States Patent [19]
Gupta et al.

[11] Patent Number: 5,212,013
[45] Date of Patent: May 18, 1993

[54] INORGANIC WIRE INSULATION FOR SUPER-CONDUCTING WIRE

[75] Inventors: Tapan K. Gupta, Monroeville; George J. Bich, Pittsburgh, both of Pa.; William N. Lawless, Westerville, Ohio

[73] Assignee: The United States of America as represented by the Secretary of the Air Force, Washington, D.C.

[21] Appl. No.: 205,029

[22] Filed: Jun. 9, 1988

Related U.S. Application Data

[63] Continuation of Ser. No. 880,243, Jun. 30, 1986, abandoned.

[51] Int. Cl.$^5$ .................................... B32B 15/00
[52] U.S. Cl. .................... 428/381; 428/384; 174/110
[58] Field of Search ............. 427/62; 428/381, 384

[56] References Cited

U.S. PATENT DOCUMENTS

| | | | |
|---|---|---|---|
| 3,089,787 | 5/1963 | Sattler et al. | 117/215 |
| 3,291,638 | 12/1966 | Stadlen et al. | 117/231 |
| 3,489,604 | 1/1970 | Benz | 428/662 |
| 3,749,811 | 7/1973 | Bogner et al. | 174/15 C |
| 3,985,281 | 10/1976 | Diepers et al. | 228/148 |
| 4,178,677 | 12/1979 | Weisse et al. | 29/605 |
| 4,261,097 | 4/1981 | Weisse | 29/599 |
| 4,407,062 | 10/1983 | Sutcliffe et al. | 29/599 |
| 4,429,007 | 1/1984 | Bich et al. | 428/389 |
| 4,564,564 | 1/1986 | Schuller et al. | 428/662 |

OTHER PUBLICATIONS

Gupta, T. K., et al, "Inorganic Dielectric Insulation for Superconducting Nb$_3$Sn Wire", Advances in Cryogenic Engineering Materials, vol. 32, pp. 225–234 (1986).

Lawless et al, "Enthalpy–Improved Dielectric Insulation for Superconducting Wires".

Lawless, W., et al "Dielectric Insulation for Superconductors" Final Report.

*Primary Examiner*—Sam Silverberg
*Attorney, Agent, or Firm*—Bernard E. Franz; Donald J. Singer

[57] ABSTRACT

The need for high current, high field, low loss, stable superconductors has led to the development of multifilamentary Nb$_3$Sn as the most promising candidate for use in superconducting machines. However, the brittle nature of Nb$_3$Sn and the high reaction temperature (~700° C.) required to form it preclude the use of standard organic insulation systems. A recently developed class of high temperature dielectric materials which are characterized by unusually large specific heats and thermal conductivities at cryogenic temperatures offers the opportunity of providing increased enthalpy stabilization in a superconducting winding, as well as the required dielectric strength. The inorganic insulation system consists of a composite glass and ceramic powder vitrified at a temperature which coincides with the superconducting formation temperature of 600°–800° C. The glass and the ceramic is chosen in such a way that the vitrification temperature of the composite coincides with the reaction temperature of 600°–800° C. The most successful glasses meeting this criterion are two Westinghouse glasses designated A-508 and M3072. Suitable ceramic fillers are Al$_2$O$_3$ and the Ceram Physics, Inc. ceramics SC1C and SC1A. Organic binders and solvents are used. Cladding with, e.g., nickel is preferable for the copper layer of Nb$_3$Sn wire.

2 Claims, 3 Drawing Sheets

INORGANIC WIRE INSULATION FOR SUPER-CONDUCTING WIRE

RIGHTS OF THE GOVERNMENT

The invention described herein may be manufactured and used by or for the Government of the United States for all governmental purposes without the payment of any royalty.

This application is a continuation of application Ser. No. 06/880,243, filed Jun. 30, 1986, now abandoned.

BACKGROUND OF THE INVENTION

This invention relates to inorganic wire insulation for superconducting wire, and more particularly for niobium-tin ($Nb_3Sn$) wire.

Fast pulse superconducting magnets for use in airborne AC generators, MHD generators, and energy storage devices require high current, high field, low loss, stable superconductors and associated insulation systems. The multifilamentary $Nb_3Sn$ superconductor has emerged as the most promising conductor for use in these machines. However, while the electrical properties of multifilamentary $Nb_3Sn$, with regard to both high current density and low loss, are advantageous, its mechanical properties lead to other problems. A major concern in developing an insulation system for $Nb_3Sn$ is the high formation temperature (600°-800° C.) of $Nb_3Sn$ and the fact that it is a brittle intermetallic compound and after its formation cannot be readily deformed. Its formation reaction at the formation temperature must be carried out when the wire is in its final geometry. An ideal insulation system would, therefore, be one that will not only withstand the breakdown voltage of several hundred volts at liquid He temperature but also withstand the superconductor reaction temperature of 600°-800° C. The insulation should be capable of being applied before reaction, be able to withstand the time-temperature excursion during reaction, and have no adverse effects on the electrical and mechanical properties at low superconducting temperature. In addition, it should provide good thermal contact between the wire and the enthalpy stabilizer, which is usually liquid helium, or in the best case, provide a measure of stabilization itself. This requires that the insulation must withstand this high formation temperature and yet be electrically satisfactory at low use temperature (4-8K). A further requirement of the insulation is that it must absorb the energy dissipated during fast charge and discharge of the magnet. The energy must be absorbed without allowing the temperature of the conductor to rise high enough to quench the magnet.

U.S. patents of interest include U.S. Pat. Nos. 4,407,062 to Sutcliffe et al; 4,261,097 to Weisse; 4,178,677 to Weisse; 3,985,281 to Diepers; and 3,749,811 to Bogner et al. The Sutcliffe et al '062 patent relates to a method of insulating superconductive wire by coating a $Nb_3Sn$ precursor wire with a layer of a mixture of a silicate of sodium, lithium or potassium and a second component capable of reacting with the silicate to form a ceramic, such as alumina, drying the coating and heating the coating to a temperature in excess of 500° C. to react the silicate and the second component to form the insulating ceramic. The Weisse '097 patent discloses insulating superconductor magnet windings with ceramics, glass, or quartz in the form of filaments, fabrics or nonwoven fabrics. The remaining references are of general interest.

RELATED PATENT APPLICATION

This application is related to a patent application Ser. No. 880,244 (now abandoned) entitled "High Temperature and Radiator Resistant Inorganic Insulation for Conventional Conductors", filed on the same day as this application, by the same inventors, and having the same assignee, which is hereby incorporated by reference. The disclosure of that application (along with the disclosure of this application) has been included in a divisional application Ser. No. 07/171,502 titled "Method of Coating Conductors with Inorganic Insulation", filed Mar. 10, 1988.

SUMMARY OF THE INVENTION

An objective of the invention is to provide insulation for superconducting wire for fast pulse superconducting magnets for use in airborne AC generators, MHD generators, and energy storage devices which require high current, high field, low loss, stable superconductors and associated insulation systems.

Another objective is to provide insulation which can withstand the high formation temperature and yet be electrically satisfactory at low use temperature (4-8K). A further objective is to provide insulation that is able to absorb the energy dissipated during fast charge and discharge of the magnet.

The subject invention relates to an inorganic insulation system for superconducting $Nb_3Sn$ wire which consists of a composite powder and vitrified at a temperature which coincides with the superconducting formation temperature of 600°-800° C. The inorganic composite insulation consists of a glass and ceramic powder similar in detail to that described in said related patent application. However, critical to the development of inorganic insulation for superconducting $Nb_3Sn$ is that the glass and the ceramic be chosen in such a way that the vitrification temperature of the composite coincides with the reaction temperature of 600°-800° C. The most successful glasses meeting this criterion are two Westinghouse glasses designated A-508 and M3072. Suitable ceramic fillers are the Ceram Physics, Inc. ceramics SC1C and SC1A. The organic binders and solvents are similar to those disclosed in said related patent application. Cladding or plating with, e.g., nickel is preferable for the copper layer of $Nb_3Sn$ wire.

DETAILED DESCRIPTION

Figure 1:
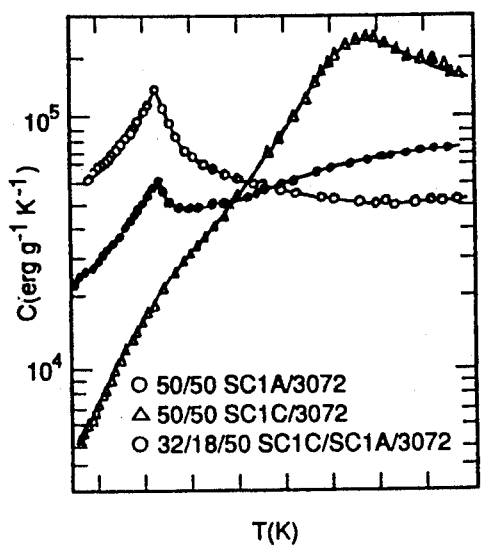
FIG. 1 is a graph showing the specific heat of ceramic/glass composites.

Fast pulse superconducting magnets for use in airborne AC generators, MHD generators, and energy storage devices require high current, high field, low loss, stable superconductors and associated insulation systems. The multifilamentary $Nb_3Sn$ superconductor has emerged as the most promising conductor for use in these machines. A major concern in developing an insulation system for $Nb_3Sn$ is the high formation temperature (700°–800° C.) of $Nb_3Sn$ and the fact that it is brittle after its formation and cannot be deformed. This requires that the insulation must with stand this high formation temperature and yet be electrically satisfactory at low use temperature (4–8K). A further requirement of the insulation is that it must absorb the energy dissipated during fast charge and discharge of the magnet. The energy must be absorbed without allowing the temperature of the conductor to rise high enough to quench the magnet.

A unique opportunity to achieve the objectives of the invention is offered by the possible application of a new class of dielectric material as insulation coating for the $Nb_3Sn$ wire. These materials (W. N. Lawless, C. F. Clark, R. W. Arnez, Final Report AFWAL-TR-82-2056 Air Force Contract 33615-80-C-2022, 1982 available from NTIS as AD-A13185) are characterized by high specific heats and thermal conductivities at low temperature and thus can provide large enthalpy for thermal stabilization of superconducting wires. Recent advances in the development of thin dielectric coatings have proved beyond doubt that these enthalpy stabilizing materials can be successfully applied very close to the potential heat source; i.e., directly on the superconductor as an insulation coating.

With this objective in mind, the Air Force has supported a series of programs for developing an enthalpy stabilizing dielectric film-type coating for superconducting $Nb_3Sn$ wire, using these materials incorporated in a glassy matrix. The development of this composite insulation system is described herein. A copy of a Final Report titled "Dielectric Insulation for Superconductors", dated September 1985, under Air Force Contract F33615-82-C-2227, is attached hereto, and is hereby incorporated by reference.

The broad picture is to incorporate the enthalpy stabilizing dielectric powders into appropriate glasses for the purpose of coating $Nb_3Sn$ wire, thereby providing not only the electrical insulation, but also a significant enthalpy stabilization to the superconductor. Presented hereinafter is the state-of-the-art characteristic of this insulation system, with special emphasis on properties and compatibility between the insulation and the wire.

CRITICAL CONSIDERATIONS FOR DEVELOPING ENTHALPY STABILIZED DIELECTRIC COATING

Three critical considerations are required for designating the dielectric coating: 1) enthalpy stabilization of the coating, 2) high formation temperature (700°–800° C.) of $Nb_3Sn$, and 3) compatibility between coating and $Nb_3Sn$. These considerations are briefly described in the following.

1) Enthalpy stabilization refers to the ability of the coating to absorb thermal energy produced within the magnet winding. The coating acts as a buffer; the thermal energy is eventually conducted to the helium coolant. The time scale of the disturbance and the geometry of the winding determine which thermal properties of the coating material are most important. The spatial distribution of the disturbance does not affect which thermal properties are most important for the coating, but only the relative importance of the thermal properties of the coating and the wire. Three cases can be identified. The thermal relaxation time, $\tau$, of the coating is needed to identify these cases and is given by $$\tau = d^2/\alpha \tag{1}$$

where d is the coating thickness, and $\alpha$ is the thermal diffusion coefficient. For disturbances shorter than the thermal relaxation time, the thermal energy absorbed by the coating is proportional to the thermal property group (M. Jakob and G. Hopkins, "Elements of Heat Transfer," J. Wiley (1957), p. 65)

$$\eta = \sqrt{K\rho C} = K/\sqrt{\alpha} \tag{2}$$

where K is the thermal conductivity, $\rho$ is the density, and C is the gravimetric specific heat. The second case occurs when the disturbance time is no longer than $\tau$ and the coating is not in direct contact with helium or any other thermal energy absorbed by the coating is then proportional to the volumetric heat capacity, $C - \rho c$. The third case occurs when the disturbance time is longer than $\tau$ and the coating is in direct contact with a thermal energy sink such as a helium bath. The thermal energy absorbed by the coating can then be passed on to the heat sink, and the energy absorbed becomes proportional to the thermal conductivity, K, of the coating. To summarize, either $\eta$, K, or C can be the most important thermal property of the coating, depending upon the temporal length of the disturbance and the winding geometry.

2) The second constraint comes from the high formation temperature of $Nb_3Sn$ and the poor strain tolerance of the formed $Nb_3Sn$. The $Nb_3Sn$ is generally formed by heat treating at temperature between 700°–800° C. for many hours. Once it is formed it is brittle, and straining the wire more than 0.07% degrades the critical current. This requires that the winding be carried out prior to formation reaction. Consequently, the insulation that needs to be developed should be capable of being applied before the reaction, be able to withstand the time-temperature excursion during the reaction, and should exhibit no adverse effect on electrical or mechanical properties of the wire. Because of the high reaction temperature, the organics are thus ruled out, and inorganics are prescribed.

3) The third constraint is imposed by the compatibility requirement between the insulation and the superconductor. The insulation must be compatible with electrical, mechanical, thermal, and chemical properties of the $Nb_3Sn$ superconductor. It must not degrade the superconducting current while exhibiting high electrical resistance, high breakdown voltage, and satisfactory enthalpy stabilization in zero and intense magnetic field. It is desired that the formation temperature of the coating and the reaction temperature of $Nb_3Sn$ be the same, and no adverse chemical reaction occurs between the insulation and the superconductor. To achieve this goal, it was necessary to use a protective layer of nickel on the outer copper substrate of the $Nb_3Sn$ wire, although other metals were also found satisfactory.

DETAILS OF INVENTION

As has been learned previously, the formation of an inorganic coating requires initially (green coat) a mixture of (1) a glass, (2) an inorganic ceramic oxide, (3) an organic binder and (4) a solvent. Critical to the development of inorganic insulation for superconducting $Nb_3Sn$ is that the glass and the ceramic be chosen in such a way that the vitrification temperature of the composite consisting of the glass and the ceramic coincides with the reaction temperature of 600°–800° C. as discussed before. The most successful glasses which meet the above criteria are the two Westinghouse glasses designated as A508 and M3072 (see Table I). The $Al_2O_3$ is a good ceramic filler in the composite and has satisfactory thermal properties at liquid He temperature to provide a built-in enthalpy stabilization in the coating itself. The other ceramic oxide powders are trade named SC1C and SC1A ceramics made by Ceram Physics Inc. of Westerville, Ohio. These ceramics are known to have high specific heat and thermal conductivity at liquid He temperature, and experiments have shown that they maintain these properties in the composites. Inorganic coatings made with $Al_2O_3$, SC1C and SC1A in combination with A-508 and M3072 glasses show excellent electrical and thermal properties as described in the monthly reports to the Air Force under contract #F33615-82-C-2227 and 2229. The organic binders and solvents are similar to those described in our said related patent application.

Since the superconducting $Nb_3Sn$ is normally formed by embedding in a copper matrix, the outer layer of the wire is copper metal. The fact that the inorganic insulation as well as the superconducting reaction will require an excursion to a temperature of 600°–800° C., preferably in an oxidizing atmosphere, made it necessary to consider a protective layer on the copper substrate either as an inert material or as a protective coating that will accept a suitable insulation. Past experience has shown that a suitable metal layer on copper substrate will satisfy this requirement. This metal layer can be applied either by cladding or preferably, by plating. A host of protective metal layers have been evaluated for this program and Ni, Inconel and Cr were found to be satisfactory. Of these, Ni is most preferable because it can be plated onto the outer copper layer of $Nb_3Sn$ wire without a major problem.

The properties of the insulation coating evaluated can be summarized as follows. There was no degradation of the critical current of the superconducting wire upon application of the insulation. A breakdown voltage of approximately 500–1000 volts/mil and an electrical resistance of $10^{10}$-ohm on twisted pair were obtained at liquid nitrogen temperature. These insulations showed good adhesion and high scrape and abrasion resistance upon vitrification. In the green state, the insulated wire could be bent and stretched to form a coil. Desirable thermal properties were imparted to the insulation by incorporating SC1C and SC1A to the composite as described previously. Furthermore, the coating did not show any degradation in magnetic field or under thermal shock condition.

Many coating compositions were evaluated during this study. The satisfactory range of composition in the "green" and "vitrified" states can be summarized as follows:

| (a) Green Coating Composition | |
|---|---|
| Glass | 35–45% |
| Ceramic | 20–30% |
| Organic Binder | 30–40% |
| (b) Vitrified Coating Composition | |
| Glass | 55–65% |
| Ceramic | 35–45% |

TABLE I
COMPOSITIONS OF WESTINGHOUSE GLASSES
weight %

| Oxides | A-508 | M3072 |
|---|---|---|
| $SiO_2$ | 40.00 | 55.00 |
| $Al_2O_3$ | 6.00 | 4.00 |
| $K_2O$ | 12.00 | — |
| $Na_2O$ | 8.00 | 11.00 |
| BaO | 10.00 | 20.00 |
| SrO | 2.00 | — |
| CaO | 3.00 | 6.00 |
| MgO | 0.50 | — |
| ZnO | 6.00 | — |
| $TiO_2$ | 2.00 | — |
| $V_2O_5$ | 6.00 | — |
| $As_2O_3$ | 0.50 | — |
| $Li_2O$ | 4.00 | — |
| $Y_2O_3$ | — | 4.00 |

EXPERIMENTAL RESULTS

A large number of materials and combinations thereof were studied, as disclosed in the Final Report titled "Dielectric Insulation for Superconductors", dated September 1985, under Air Force Contract F33615-82C-2227, attached hereto. A few examples are presented here of the coating composition and its characteristics from a broad range of studies undertaken.

Two high specific heat ceramics reported here are: SC1C, a chromite-spinel ceramic, and SC1A, a niobate-columbite ceramic. The SC1C has an enormous specific heat maxima at 8K of 2 J $cm^{-3}K^{-1}$, and SC1A has a specific heat maximum at 4.2K of 0.3 J $cm^{-3}K^{-1}$. Of several glasses investigated in this study, the one that will be discussed here is labeled 3072, developed specifically for this study. In a previous study (W. N. Lawless, C. F. Clark, and T. K. Gupta, in *Advances in Cryogenic Engineering (Materials)*, Vol. 30, ed. A. F. Clark and R. P. Reed, Plenum Press, New York (1984), pp. 433–440), other glasses were investigated in making a composite with SC1C and SC1B, a ceramic analagous to SC1A. Adhesion of the those glasses to the wire proved unsatisfactory, so new glasses were developed which showed much improved adhesion. Pore-free bulk samples of cylindrical shape were prepared of various compositions by hot pressing at 800° C. The composite compositions that will be reported in this paper for *bulk* samples are: 50/50 weight ratios of SC1A/3072, SC1C/3072, and a ternary composite 32/18/50 SC1C/SC1A/3072. Simultaneous studies were conducted on composite compositions for *coating* and the one that will be described here is 40/60 SC1C/3072. The reason for higher glass content was to ensure better adhesion of the coating to the wire. This reduced the thermal characteristic only very slightly. The coating was applied by first preparing a slurry of a mixture of glass, ceramic, organic binder, and solvent, and then drawing the wire through the slurry using the conventional wire enameling equipment. The coating thus developed is called the "green coating", which is then heat treated at 700°–800° C. to obtain what is known as "fired" or "vitrified" coating. At this stage, the glass has melted with the ceramic embedded in the glass and adhered strongly to the wire. The green coating is flexible enough to allow twisting, bending, and coiling. The tests samples are prepared from the green coating in the form of a twisted pair, standard in organic enamel industry (according to IEEE specification), and heat treated at various temperatures to obtain the vitrified test samples.

Bulk Samples

Specific heat and thermal conductivity data (zero field) were measured in the adiabatic calorimeter described elsewhere (W. N. Lawless, Phys. Rev. B14, p. 134). Specific heat measurements in intense magnetic fields were performed at National Magnet Laboratory (MIT) by a drift technique using capacitance thermometry (W. N. Lawless, C. F. Clark, R. W. Arnez, Rev. Sci. Instrum. 53, (1982), p. 1647).

The specific heat data on pore-free SC1A/3072, SC1C/3072, and SC1A/SC1C/3072 composites are shown in FIG. 1. The sharp peak for SC1A and the broad-based peak for SC1C bulk ceramics at appropriate temperatures are maintained in the composites, indicating the absence of any adverse reaction between the ceramic and the glass. The broad maximum centered at approximately 8K for SC1C/3072 composite may be due to correlation effects in the fine grain (approximately 1 $\mu$m) SC1C powder also observed previously for SC1C/7570 composite (W. N. Lawless, C. F. Clark, and T. K. Gupta, in *Advances in Cryogenic Engineering (Materials)*, vol. 30, ed. A. F. Clark and R. P. Reed, Plenum Press, New York (1984)).

Figure 2:
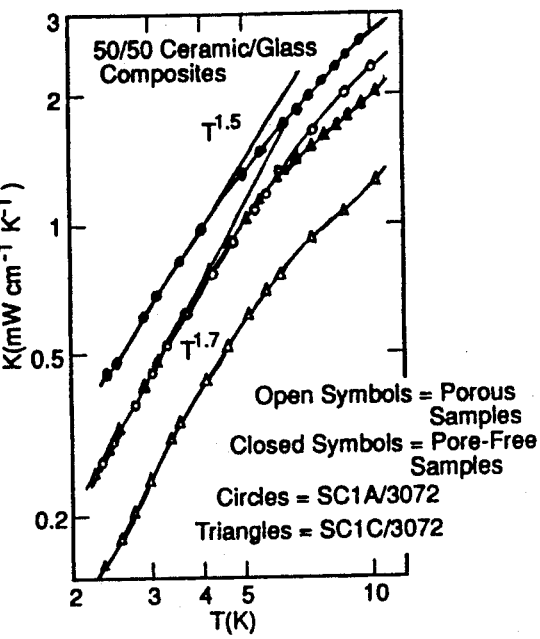
FIG. 2 is a graph showing the thermal conductivities of dense and porous ceramic/glass composites.

Thermal conductivity data measured on the 50/50 ceramic/glass composites are shown in FIG. 2. Also shown in this figure is the results on samples which had approximately 10% porosity. Porosity decreases the SC1C/3072 thermal conductivity by approximately 31%. These results are of import because the coating was nearly 100% dense, and we intended to correlate the bulk thermal data to those of coatings. Turning further to FIG. 2, the thermal conductivities follow $K\alpha T^m$ where $m=1.5$ and 1.7 for SC1A/3072 and SC1C/3072 composites, respectively. To a first approximation, one would associate these exponents to Kapitza limited phenomena, but other studies have indicated that there are no Kapitza effects in SC1C/3072 composite. We remark here that the absence of Kapitza effect is one of the reasons for choosing SC1C/3072 composite as a leading candidate for wire coating.

Figure 3:
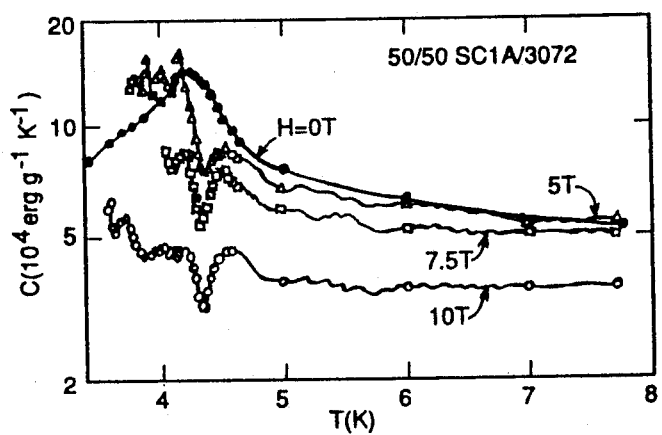
FIG. 3 is a graph showing the magnetic-field dependence of the specific heat of SC1A/3072 composite.
Figure 4:
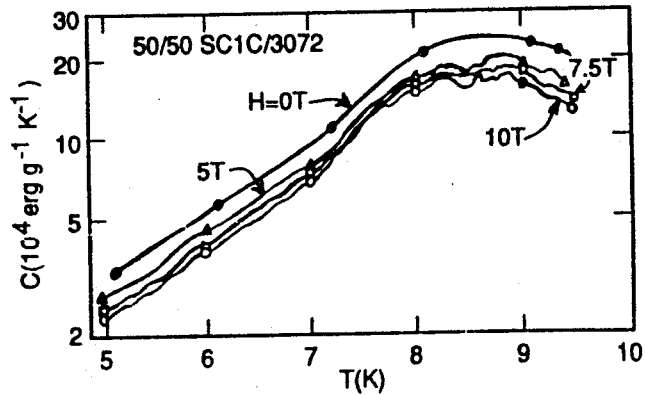
FIG. 4 is a graph showing the magnetic-field dependence of the specific heat of SC1C/3072 composite.

Specific heat data measured in intense magnetic fields on SC1A/3072 and SC1C/3072 composites are shown in FIGS. 3 and 4, respectively. The two composites behave very differently in intense magnetic fields. The specific heat maximum is depressed with field for SC1A/3072 composite, whereas the broad-based maximum is still retained even at 10 T for SC1C/3072 composite. The reason for peak-depression is not readily understood and would require fundamental studies.

Figure 5:
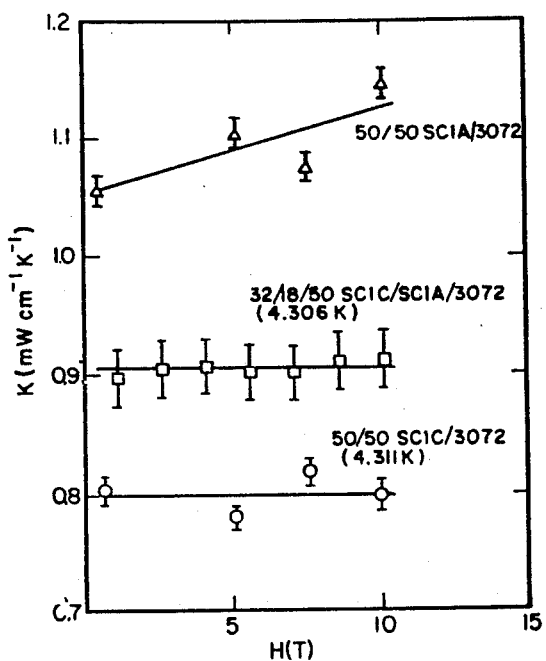
FIG. 5 is a graph showing the magnetic-field dependence of the thermal conductivities of ceramic/glass composites.

The thermal conductivity data for these composites, along with the ternary composite, are shown in FIG. 5. The experimental uncertainty for these measurements is shown by the error bars. The SC1C/3072 and SC1A/SC1C/3072 composites have apparently H-field independent thermal conductivities. The SC1A/3072 composite, however, appears to have a slight H-field dependent which cannot be attributed to experimental uncertainties.

Coated Wire Samples

The coating studies can be broadly divided into two categories: those conducted on Cu wire and those on Nb$_3$Sn wire. The bulk of the coating evaluation was done on samples made from Cu wire. This is due to the fact that most of Nb$_3$Sn wire has an exposed surface of Cu, and, as such, it was argued that an insulation system developed for Cu will apply equally well to Nb$_3$Sn. The other reason for testing Cu wire is the high cost and scarcity of Nb$_3$Sn wire. Both wires had Ni-plating on the outer surface. Tests were conducted on both "green" and "vitrified" twisted pairs. The thickness of the green coating was typically $5.5 \times 10^{-3}$–$7.5 \times 10^{-3}$ cm (2–3 mil) and that of the vitrified coating was typically $2.5 \times 10^{-3}$–$3.8 \times 10^{-3}$ (1–1.5 mil).

Figure 6:
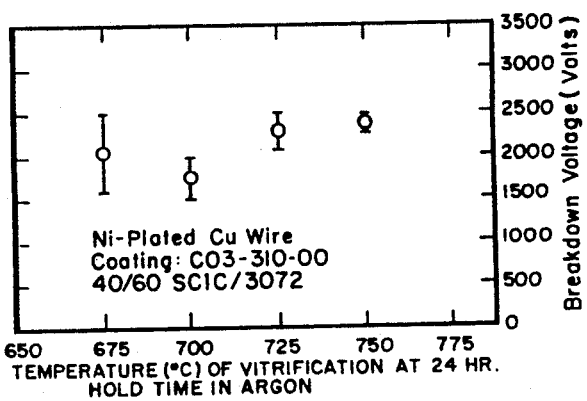
FIG. 6 is a graph showing the breakdown voltage of the dielectric coating as a function of vitrification temperature.

Typical examples of mechanical and electrical characteristics of the "green" dielectric coatings applied on both Cu and Nb$_3$Sn wires are shown in Table 1. Since no standard test parameters were generated along the line of organic enamel coating modified by the brittle nature of the ceramic/glass coating. The test data presented in Table 1 when compared with the characteristics of a typical organic insulation can be considered quite satisfactory. The coating exhibits high flexibility and high resistance to scrape and abrasion, and high electrical strength. The breakdown strength of the vitrified coating as a function of vitrified temperature is shown in FIG. 6 for Ni-plated Cu wire. These data represent one of the best breakdown voltages obtained in this program and are substantially in excess of 500 volts targeted for this program. These coatings also showed excellent adhesion to the wire after vitrification, and in some cases sand blasting was required to remove the coatings from the wire.

DISCUSSION

Figure 7:
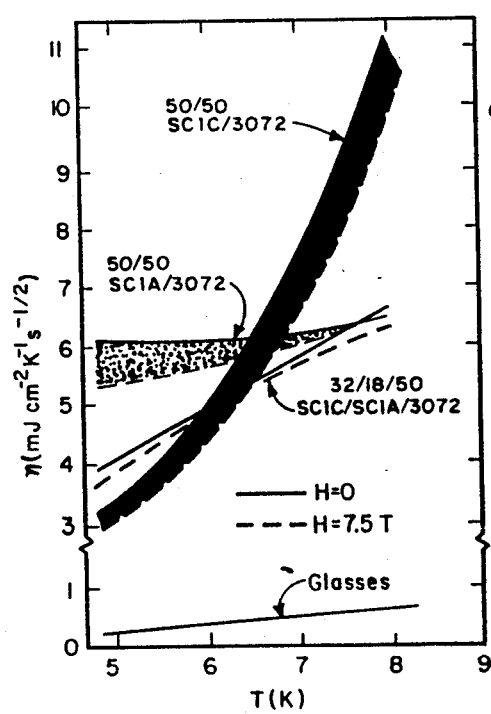
FIG. 7 is a graph showing the transient thermal parameter $\eta$ as a function of temperature and field.

What we have tried to demonstrate is a novel method of enthalpy stabilization of superconducting magnet through the development of inorganic film-type coatings on Nb$_3$Sn wire, the coating having the characteristic of high thermal capacity combined with high electrical strength. Taking the case of enthalpy stabilization, it is instructive to evaluate the $\eta$-parameters for the composites from the thermal data of the bulk samples. The procedure followed was to compute $\eta$ for $H=0$ and $H=7.5$ T using the appropriate specific heat, thermal conductivity, and density data. The $\eta$-parameter data at tempetature 5–8K are shown in FIG. 7 where the band of $\eta$-values ($H=0$, 7.5 T) is shown for each of the three composites discussed in this paper. Also shown for comparison are the $\eta$-data for glasses which are the only other potential dielectric insulation for Nb$_3$Sn. The composites represent an improvement in the $\eta$-parameter $\approx$20 times.

One can conclude that for 50/50 ceramic/glass composites, the SC1A/3072 composite is superior up to 6.5K; the SC1C/3072 composite is superior above 6.5K. The ternary SC1C/SC1A/3072 composite appears to offer no particular advantage. For all composites, the $\eta$-parameters are decreased by the field ($H=7.5$ T), but this suppression is relatively minor. This is one of the major findings in this program; namely that the thermal properties of these insulation coatings are not greatly affected by intense magnetic fields.

Turning to the dielectric coating, it can be stated that the inorganic film-type coating consisting of a ceramic and a glass offers a very satisfactory solution to the conflicting requirements of a high reaction temperature Nb₃Sn and a low use temperature (4–8K) of superconducting environment. The additional attractive feature is that the coating formation (vitrification) and Nb₃Sn reaction can be accomplished simultaneously. The vitrified coating shows a high degree of scrape and abrasion resistance combined with resistance to thermal shock upon immersion to liquid nitrogen or helium bath. The vitrified coating maintains a high insulation resistance with resistivity values measured at $\rho \sim 11\text{-}12$ ohm-cm and a high breakdown voltage with values in excess of 500 volts, both in liquid nitrogen. Furthermore, the residual resistance ration (RRR), measured for coated and uncoated wires which were heat treated similarly, showed no significant difference in values. The coating is very compatible with the Nb₃Sn wire.

TABLE II

"Green" Coating Characteristics
Coating Identification C03-310-00
Coating Composition 40/60 SC1C/3072

| Parameters | Ni-Plated Cu Wire | Ni-Plated Nb₃Sn Wire |
|---|---|---|
| Wire Size | #20 AWG | #20 AWG |
| Coated Surface | Fairly Smooth | Very Smooth |
| Build | $5.0 \times 10^{-3}$ cm (2 mil) | $5.0\text{-}5.5 \times 10^{-3}$ cm (2.0–2.2 mil) |
| Flexibility: | | |
| 1. Quick Snap | passes | passes |
| 2. Elongation + 5X Mandrel Wrap | 20% | greater than 5% |
| 3. e bend | passes | passes |
| Scrape Abrasion (No. of cycles @ 350 g lead) | 33, 48, 56 52, 63, 17 | 12, 34, 24 36, 22, 18 |
| Electric Breakdown (volts) | 1000, 960, 820 790, 920, 990 | 1700, 1600, 1250 1200, 1100, 1500 |
| Insulation Resistance megohms @ 50 volts (on twisted air) | greater than 20,000 | greater than 20,000 |

Figure 8:
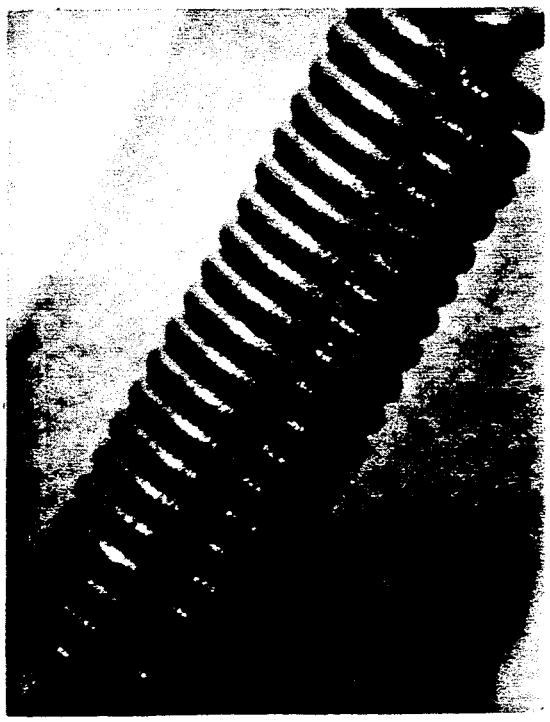
FIG. 8 is a photographic view of a green-coated $Nb_3Sn$ wire in the form of a coil.

Finally, the green coating is highly conformable; i.e., it is extremely amenable to coil formation which can be vitrified to give final coil configuration. A photograph of a green-coated unreacted wire wrapped on a ~6.4 mm (¼") mandrel is shown in FIG. 8, illustrating the flaw-free green coating. This then readily conforms to the "react-after-winding" (RAW) scheme that is now being pursued in a separate Air Force program for making small coils of Nb₃Sn wire.

CONCLUSION

The Nb₃Sn superconductor wire promises to provide high power density and low losses for superconducting magnets and generators for which there had been no adequate insulation system for the wire because of its high reaction temperature. This invention describes the first breakthrough in the development of an inorganic insulation coating for Nb₃Sn wire which will withstand the mechanical, electrical and thermal transients developed during excitation of a superconducting magnet. The major achievements are the (1) development of a barrier metal layer e.g. Ni on which an inorganic insulation can be satisfactorily built, (2) development of a composite composition of a glass and a cermic where the reaction temperature coincides with the vitrification temperature and finally, (3) development of an insulation system where the improved enthalpy stabilization and electrical insulation are simultaneously built into the insulation.

It is understood that certain modifications to the invention as described may be made, as might occur to one with skill in the field of the invention, within the scope of the appended claims. Therefore, all embodiments contemplentated hereunder which achieve the objects of the present invention have not been shown in complete detail. Other embodiments may be developed without departing from the scope of the appended claims.

What is claimed is:

1. An insulated electrical conductor for fast pulse superconducting magnets and energy storage devices which require high current, high field, low loss, stable superconductors and associated insulation systems, which can withstand a high formation temperature and yet be electrically satisfactory at low use temperature (4–8K), and which is able to absorb energy dissipated during fast charge and discharge of a magnet, said insulated electrical conductor comprising, in combination, a superconducting Nb₃Sn wire and an inorganic insulation system;

the wire being formed by embedding Nb₃Sn in a copper matrix having a protective coating layer selected from the group consisting of Ni, inconel and Cr;

the insulation being formed from a green coating composition which comprises a composite of 35–45% glass, 20–30% of an inorganic ceramic oxide powder, 30–40% of an organic binder and a solvent, chosen so that the vitrification temperature coincides with the superconducting formation temperature of 600°–800° C., and vitrified on the wire at said temperature, the vitrified insulation being 55–65% glass and 35–45% ceramic;

said glass being selected from the group consisting of a first glass (A-508) of a composition comprising by weight approximately 40% SiO₂, 6% Al₂O₃, 12% K₂O, 8% Na₂O, 10% BaO, 2% SrO, 3% CaO, 0.5% MgO, 6% ZnO, 2% TiO₂, 6% V₂O₅, 0.5% AS₂O₃, and 4% Li₂O; and a second glass (M3072) of a composition comprising by weight approximately 55% SiO₂, 4% Al₂O₃, 11% Na₂O, 20% BaO, 6% CaO, and 4% Y₂O₃;

wherein the ceramic is selected from the group consisting of a first ceramic (SC1C) having a chromite-spinal type structure, a second ceramic (SC1A) having a niobate-columbite type structure (SC1A), and a mixture which includes said first and said second ceramics.

2. An insulated electrical conductor for fast pulse superconducting magnets and energy storage devices which require high current, high field, low loss, stable superconductors and associated insulation systems, which can withstand a high formation temperature and yet be electrically satisfactory at low use temperature (4–8K), and which is able to absorb energy dissipated during fast charge and discharge of a magnet, said insulated electrical conductor comprising, in combination, a superconducting Nb₃Sn wire and an inorganic insulation system;

the wire being formed by embedding Nb₃Sn in a copper matrix having a protective coating layer of nickel;

the insulation being formed from a green coating composition which comprises a composite of 35–45% glass, 20–30% of an inorganic ceramic oxide powder, 30–40% of an organic binder and a solvent, chosen so that the vitrification temperature coincides with the superconducting formation temperature of 600°–800° C., and vitrified on the wire at said temperature, the vitrified insulation being a pore-free composite comprising 55–65% glass and 35–45% ceramic;

said glass (M3072) being of a composition comprising by weight 55% $SiO_2$, 4% $Al_2O_3$, 11% $Na_2O$, 20% BaO, 6% CaO, and 4% $Y_2O_3$;

wherein the ceramic (SClC) has a chromite-spinal type structure.

* * * * *